(12) United States Patent
Shin (10) Patent No.: US 8,030,738 B2
(45) Date of Patent: *Oct. 4, 2011

(54) SEMICONDUCTOR DEVICE WITH RESISTOR PATTERN AND METHOD OF FABRICATING THE SAME

(75) Inventor: Yoo-Cheol Shin, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1405 days.

This patent is subject to a terminal disclaimer.

(21) Appl. No.: 11/426,546

(22) Filed: Jun. 26, 2006

(65) Prior Publication Data

US 2006/0246654 A1    Nov. 2, 2006

Related U.S. Application Data

(62) Division of application No. 10/675,336, filed on Sep. 29, 2003, now Pat. No. 7,109,566.

(30) Foreign Application Priority Data

Oct. 9, 2002    (KR) .................. 2002-61403

(51) Int. Cl.
*H01L 21/02* (2006.01)
(52) U.S. Cl. ........ 257/538; 257/536; 257/350; 257/904; 257/E27.016
(58) Field of Classification Search ................. 257/904, 257/350, 410–413, 536–538; 438/238, 239
See application file for complete search history.

(56) References Cited

U.S. PATENT DOCUMENTS

| 5,187,559 | A |   | 2/1993  | Isobe et al.            |
|-----------|---|---|---------|-------------------------|
| 5,554,873 | A |   | 9/1996  | Erdeljac et al.         |
| 5,700,717 | A | * | 12/1997 | Nowak et al. ... 438/629 |
| 5,852,311 | A |   | 12/1998 | Kwon et al.             |
| 5,959,343 | A |   | 9/1999  | Harada et al.           |
| 6,004,841 | A |   | 12/1999 | Chang et al.            |
| 2003/0030097 | A1 | * | 2/2003 | Lee et al. ... 257/314 |
| 2003/0047782 | A1 |   | 3/2003 | Hasegawa et al.         |

FOREIGN PATENT DOCUMENTS

KR    1999-002760    1/1999

OTHER PUBLICATIONS

English language abstract of Korean Publication No. 1999-002760, Jan. 15, 1999.

* cited by examiner

*Primary Examiner* — Matthew Landau
*Assistant Examiner* — Candice Chan
(74) *Attorney, Agent, or Firm* — Myers Bigel Sibley & Sajovec, P.A.

(57) ABSTRACT

Disclosed is a semiconductor device with a resistor pattern and methods of fabricating the same. Embodiments of the present invention provide a method of fabricating a resistor pattern having high sheet resistance by using a polycide layer for a gate electrode in a semiconductor device with the resistor pattern. Embodiments of the invention also provide a semiconductor device with a resistor pattern that is formed narrower than the minimum line width that can be defined in a photolithographic process so that sheet resistance thereof increases, and a method of fabricating the same.

15 Claims, 12 Drawing Sheets

SEMICONDUCTOR DEVICE WITH RESISTOR PATTERN AND METHOD OF FABRICATING THE SAME

CROSS-REFERENCE TO RELATED APPLICATIONS

This application is a Divisional of U.S. patent application Ser. No. 10/675,336, filed on Sep. 29, 2003, now U.S. Pat. No. 7,109,566, which claims priority from Korean Patent Application No. 2002-61403, filed on Oct. 9, 2002, the contents of which are herein incorporated by reference in their entirety.

FIELD OF THE INVENTION

This disclosure generally relates to semiconductor memory devices and, more specifically, to a semiconductor memory device with a resistor pattern and methods of fabricating the same.

BACKGROUND OF THE INVENTION

Semiconductor integrated circuits can be formed from active devices, such as diodes or transistors, and from passive devices such as capacitors, resistors, and inductors, in any combination. Typical integrated circuits use a resistor pattern having high resistance. Conventionally, the resistor pattern of a semiconductor device is formed of doped polysilicon having a relatively high sheet resistivity (Rs). The polysilicon is used in various parts of fabricating the semiconductor integrated circuit. A gate electrode (i.e., part of an important active device) of the transistor typically includes a polysilicon layer. Capacitor electrodes (i.e., a storage electrode and a plate electrode) are also formed of polysilicon. However, since the transistor requires a low gate resistance for low power-dissipation and a high speed-operation, the gate electrode of the transistor is typically formed of a polycide layer comprising a stacked polysilicon layer and a silicide layer.

Among semiconductor memory devices, a FLASH memory device typically includes a floating gate formed of a single layer of polysilicon and a control gate electrode formed of a polycide layer.

Figure 1:
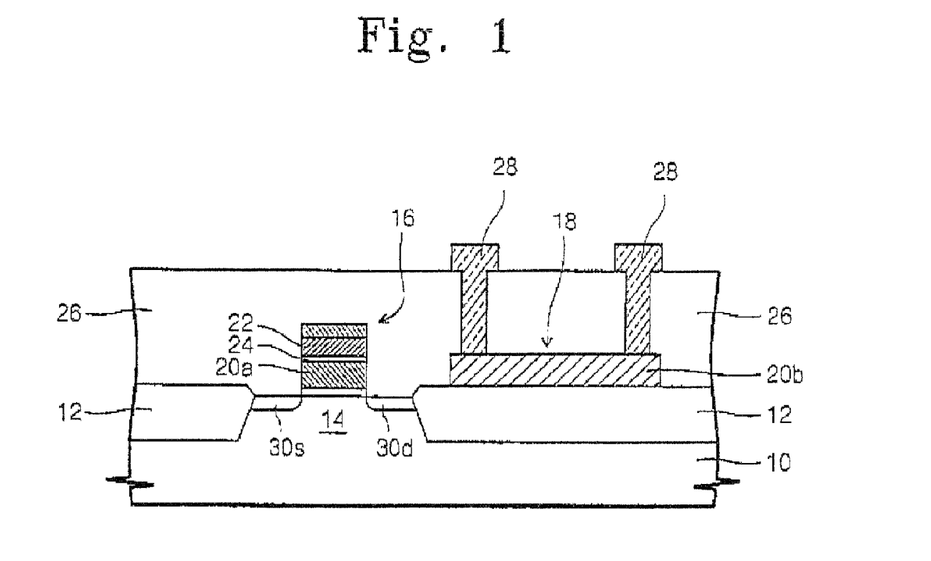
FIG. 1 is a cross-sectional diagram illustrating a cell pattern and a resistor pattern of a conventional FLASH memory device.

As illustrated in FIG. 1, a device isolation layer 12 is disposed in a substrate 10 to define an active region 14. Source and drain regions 30s and 30d are disposed in the active region 14. A gate stack 16 including a floating gate 20a, a gate interlayer dielectric layer 24, and control gate electrodes 22, which are sequentially stacked, is disposed on a substrate between the source and drain regions 30s and 30d. In addition, a resistor pattern 18 is disposed on the device isolation layer 12 and resistor electrodes 28 are connected to both edges of the resistor pattern 18. The resistor electrodes 28 are long enough to extend through an interlayer dielectric layer 26, which covers the entire surface of the substrate.

As further illustrated in FIG. 1, the cell transistor of the FLASH memory device includes the floating gate 20a, which is formed of polysilicon. This enables a resist pattern to be formed using the polysilicon layer 20b that is also used for forming the floating gate 20a.

Figure 2:
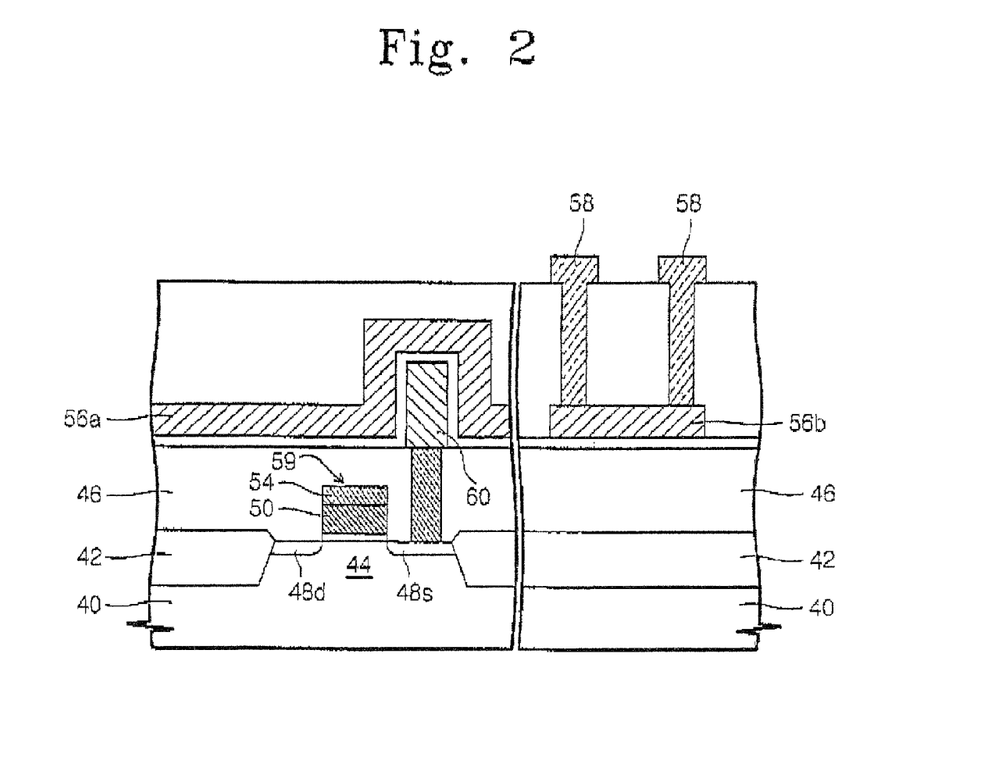
FIG. 2 is a cross-sectional diagram illustrating a cell pattern and a resistor pattern of a conventional DRAM memory device.

FIG. 2 is a cross-sectional view of a conventional DRAM memory device.

Referring to FIG. 2, in the DRAM memory device, a device isolation layer 42, defining an active region 44, is disposed on a substrate 40, and source and drain regions 48s and 48d are disposed in the active region 44. A gate electrode 59 is disposed on a substrate between the source and drain regions 48s and 48d. A capacitor is connected to the source region 48s.

The capacitor includes a lower electrode 60 connected to the source region 48s and an upper electrode 56a formed at each divided sector in a cell array region. To lower the gate resistance, the gate electrode 59 is formed of polycide that includes a polysilicon layer 50 and a silicide layer 54. Therefore, a resistor pattern may not be formed from the polysilicon layer 50 that forms the gate electrode 59. Thus, a resistor pattern 56b of the conventional DRAM memory device may be formed of a polysilicon layer that is used to form the lower electrode 60 or the upper electrode 56a. Resistor electrodes 58 are connected to both edges of the resistor pattern 56b.

As explained above, the FLASH memory device and the DRAM memory device may include a step of forming a resistor pattern formed of a single polysilicon layer during each step of forming the floating gate and the capacitor, respectively. In a semiconductor device with a polycide gate electrode, a desired resistor pattern typically is formed by making a resistor pattern of a single polysilicon layer or by reducing the thickness or the width of the polysilicon layer. A method of fabricating a resistor pattern having high sheet resistance in a semiconductor device with a polycide gate is taught in U.S. Pat. No. 6,313,516 entitled "Method for Making High-Sheet-Resistance Polysilicon Resistors for Integrated Circuits".

FIGS. 3-6 are cross-sectional views showing a method of fabricating a semiconductor device with a typical resistor pattern.

Figure 3:
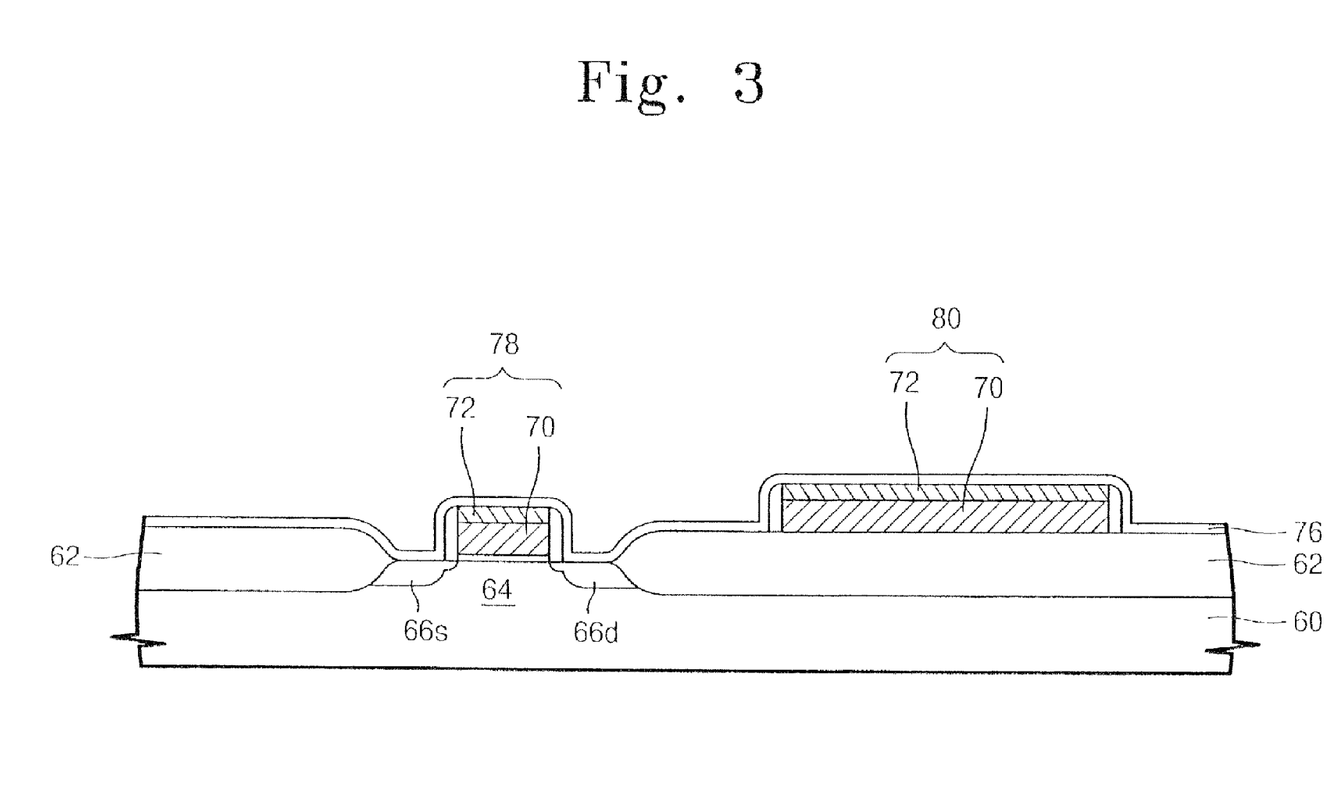
FIGS. 3-6 are cross-sectional diagrams illustrating a method of fabricating a semiconductor device with a typical resistor pattern.

Referring to FIG. 3, a device isolation layer 62 is formed in a substrate 60 to define an active region 64, and source and drain regions 66s and 66d are formed in the active region 64. A gate electrode 78 is formed on an active region 64 between the source and drain regions 66s and 66d. An interconnection or a lower electrode 80 is formed on the device isolation layer 62.

A capacitor dielectric layer 76 is further formed on the entire surface of the resultant substrate. The gate electrode 78 and the capacitor lower electrode 80 are formed of polycide comprising polysilicon 70 and refractory metal silicide 72, which are sequentially stacked.

Figure 4:
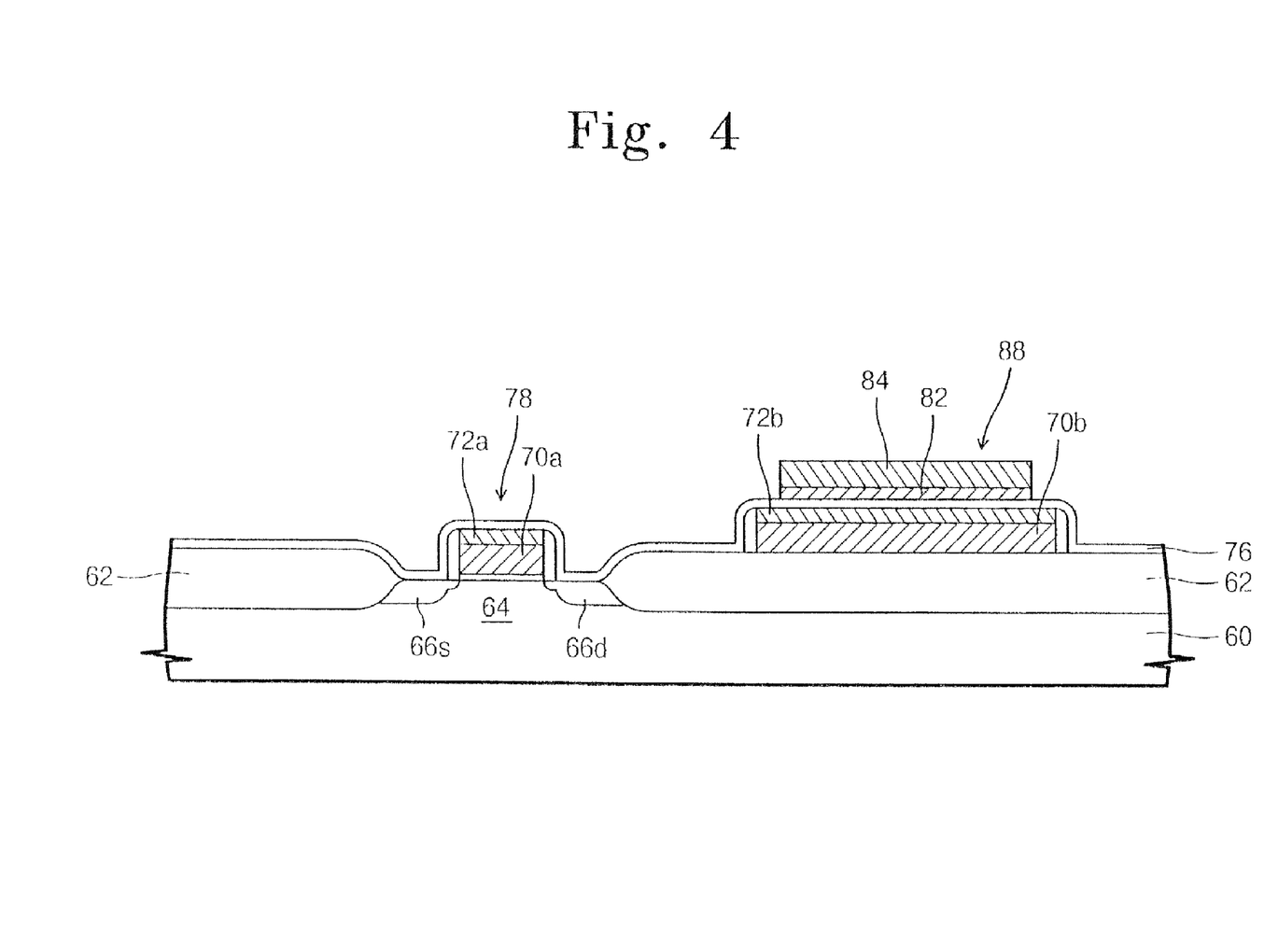

Referring to FIG. 4, a resistor pattern 88 is formed on the capacitor dielectric layer 76. The resistor pattern is formed by sequentially stacking a thin doped polysilicon layer 82 and a thick undoped polysilicon layer 84, thereby increasing sheet resistance.

Figure 5:
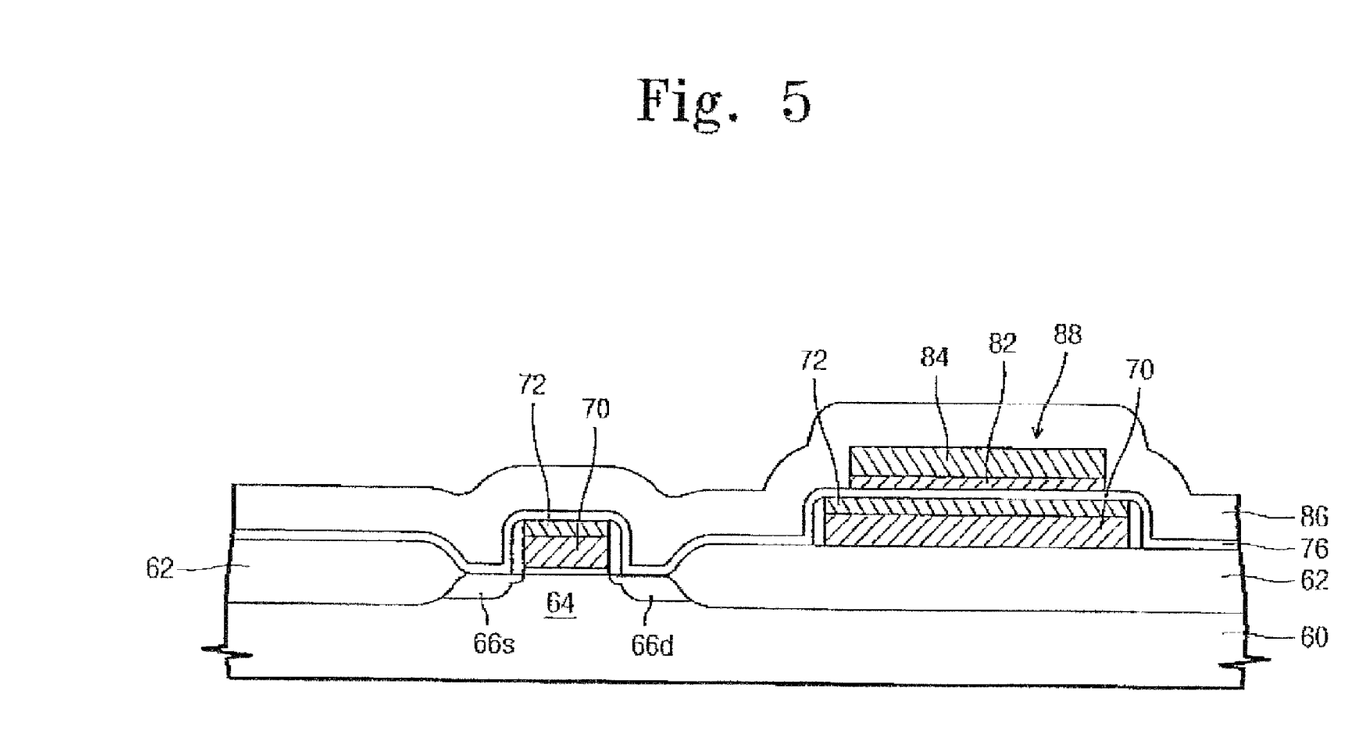
Figure 6:
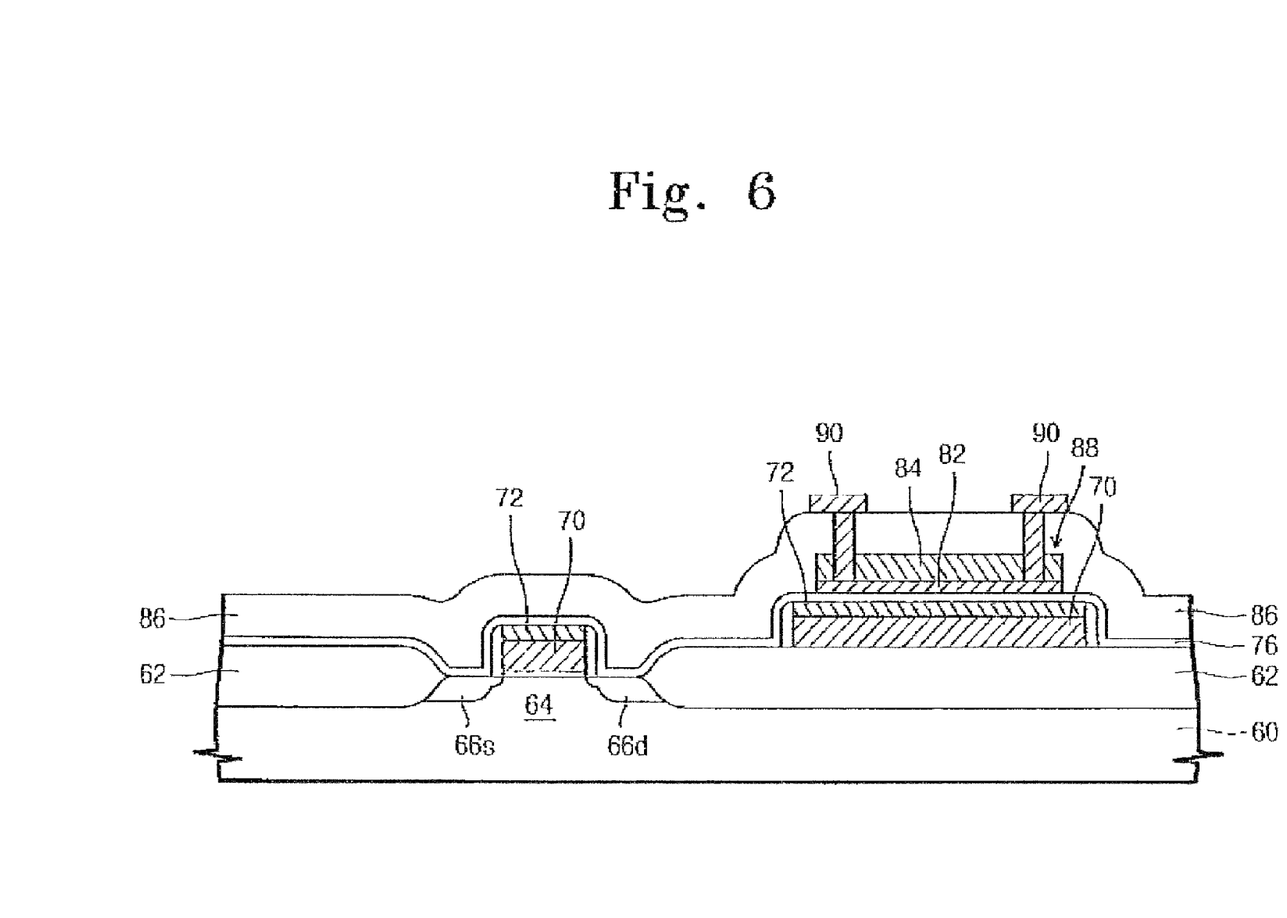

Referring to FIGS. 5 and 6, an interlayer dielectric layer 86 is formed on the entire surface of the substrate with the resistor pattern 88. Next, electrodes 90 are formed to extend through the interlayer dielectric layer 86 and connect to both edges of the resistor pattern 88.

As explained above, since the sheet resistance of polycide is low, the resistor pattern cannot be formed during formation of the gate electrode. Therefore, separate steps for forming the gate pattern and forming the resistor pattern are required, and the gate electrode and the resistor pattern are formed on different layers, thus increasing a step difference of the device.

Embodiments of the invention address these and other limitations in the prior art.

SUMMARY OF THE INVENTION

Embodiments of the present invention provide a method of fabricating a resistor pattern having high sheet resistance by using a polycide layer for a gate electrode in a semiconductor device with the resistor pattern. Embodiments of the invention also provide a semiconductor device with a resistor pattern that is formed narrower than the minimum line width that can be defined in a photolithographic process so that sheet resistance thereof increases, and a method of fabricating the same.

DETAILED DESCRIPTION OF EMBODIMENTS

The present invention will be described more fully hereinafter with reference to the accompanying drawings, in which preferred embodiments of the invention are shown. This invention, however, can be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 7A:
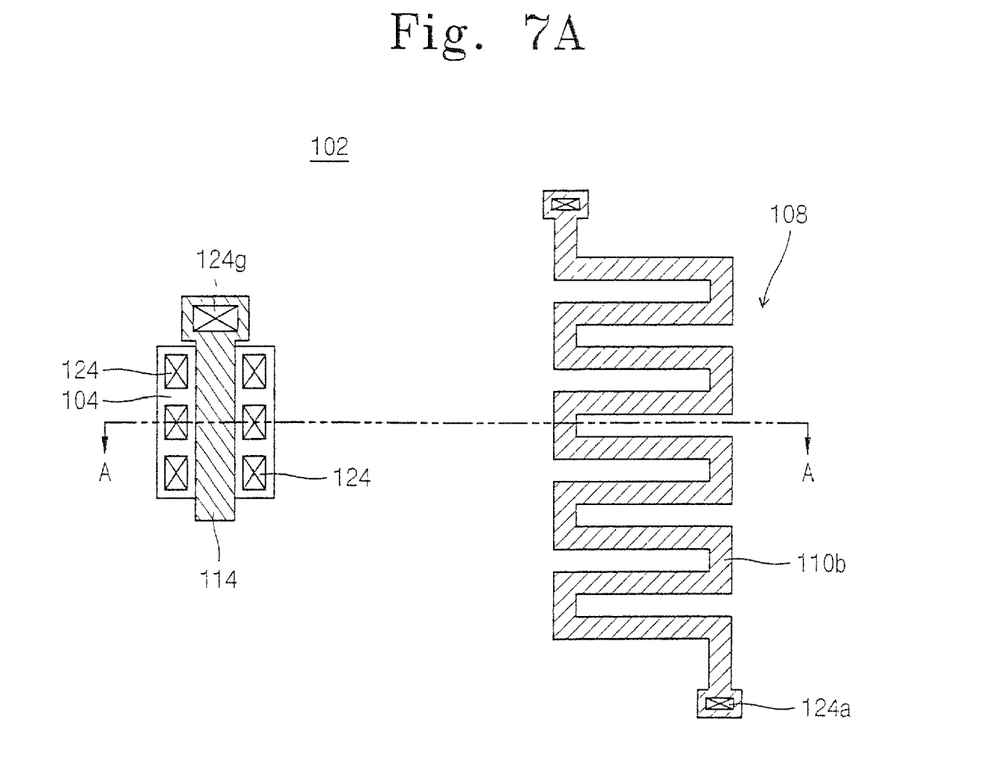
FIG. 7A is a layout diagram illustrating a semiconductor device with a resistor pattern in accordance with an embodiment of the present invention.
Figure 7B:
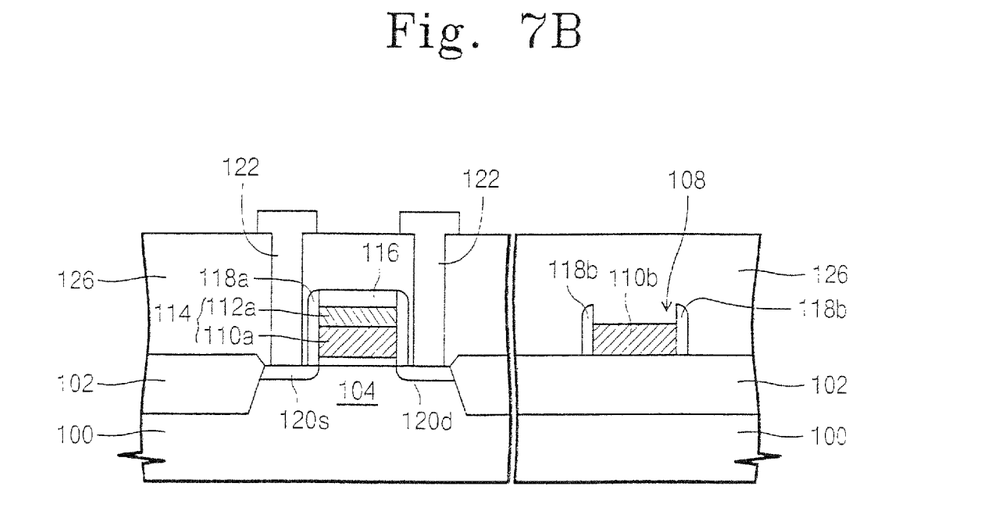
FIG. 7B is cross-sectional diagram of a semiconductor device with a resistor pattern, taken along line A-A of FIG. 7A.

Referring to FIGS. 7A and 7B, a semiconductor device having a resistor pattern in accordance with this embodiment of the present invention includes a device isolation layer 102 and an active region 104 that are disposed in a substrate 100. A source region 120s and a drain region 120d are formed in the active region 104. A gate electrode 114 is disposed on the active region 104 between the source and drain regions 120s and 120d. The gate electrode 114 may include an overlapping region on the device isolation region 102. The gate electrode 114 comprises a polysilicon pattern 110a and a metal silicide pattern 112a that are sequentially stacked, and may further comprise a gate capping insulation layer 116 on the metal silicide pattern 112a. A resistor pattern 108 is disposed on the device isolation layer 102. As illustrated in the drawings, the resistor pattern 108 is formed to be line-shaped so as to achieve high resistance and comprises a single region of polysilicon. A metal silicide layer may also be formed on the polysilicon pattern at both edges of the line-shaped resistor pattern 108. Contact plugs 122 are connected to the source and drain regions 120s and 120d, respectively. Resistor electrodes 124a are connected at both edges of the resistor pattern 108. Gate spacers 118a are disposed on sidewalls of the gate electrode 114, and resistor spacers 118b are disposed on the sidewalls of the resistor pattern 108. The gate spacers 118a may prevent a short between the contact plug 122 and the gate electrode 114 and they also form the junction structure of the source and drain regions 120s and 120d. The contact plugs 122 and the resistor electrode 124a are connected to the source region 120s, the drain region 120d, and the resistor pattern 108, respectively, through an interlayer dielectric layer 126, which covers the entire surface of the substrate. The inner sidewall of the resistor spacer 118b is substantially vertical, while the outer sidewall is curved. A portion of the vertical sidewall protrudes over the resistor pattern 108 to contact the interlayer dielectric layer 126.

Figure 8:
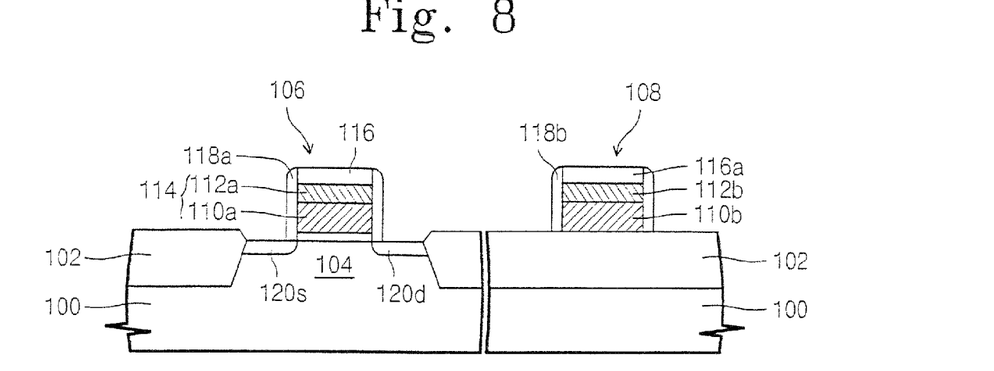
FIGS. 8-10 are cross-sectional diagrams illustrating the semiconductor device with a resistor pattern in accordance with an embodiment of the present invention, taken along line A-A of FIG. 7A.
Figure 9:
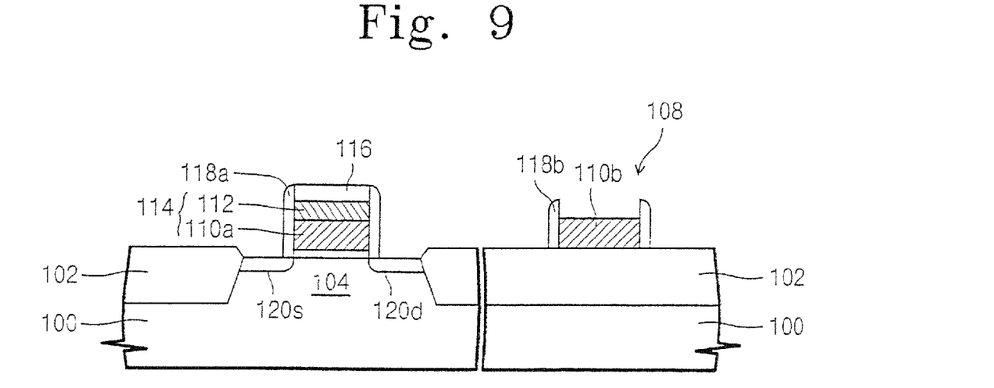
Figure 10:
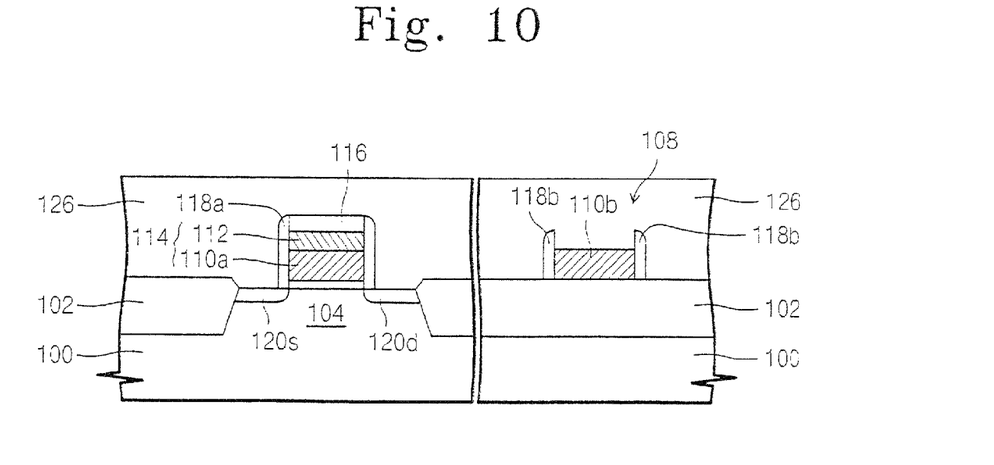

FIGS. 8-10 illustrate a method of fabricating a semiconductor device with a resistor pattern, as described above. Referring to FIG. 8, a device isolation layer 102 is formed in a substrate 100 to define an active region 104. A source region 120s, a drain region 120d, and a gate electrode 114 are formed in the active region 104. The source and drain regions 120s and 120d are formed by implanting impurities into the active region 104. The gate electrode 114 is formed with a polycide structure by sequentially stacking a polysilicon pattern 110a and a metal silicide pattern 112a. Additionally, a gate capping insulation layer 116 may be formed on the metal silicide pattern 112a. Gate spacers 118a are formed on the sidewalls of the gate electrode 114. The spacers 118a are formed so that a junction structure of the source and drain regions 120s and 120d are formed to have LDD or DDD structure, and they further prevent a short between an interconnection and the gate electrode 114, which is connected to the source and drain regions 120s and 120d. Up to this step in fabrication, a conventional semiconductor device may be employed. However, in this embodiment, a resistor pattern 108 is next formed on the device isolation layer 102. Since the resistor pattern 108, as well as the gate electrode 114, may have a polycide structure, a second polysilicon pattern 110b and a second metal silicide pattern 112b are stacked to form the resistor pattern 108. In addition, a capping insulation layer 116a may be formed on the second metal silicide pattern 112b.

Referring to FIG. 9, the second metal silicide pattern 112b of the resistor pattern 108 is etched to expose the top surface of the second polysilicon pattern 110b and a portion of the inner sidewalls of the resistor spacer 118b aligned to the sidewalls of the second polysilicon pattern 110b. The second metal silicide pattern 112b may be removed after a photoresist pattern is formed to expose the entire or a portion of the resistor pattern 108. Next the capping insulation layer 116a is etched. If only a portion of the resistor pattern 108 is exposed, the photoresist pattern then covers both edges of the line-shaped resistor pattern and the exposes the rest.

Referring to FIG. 10, an interlayer dielectric layer 126 is formed on the entire resulting surface of the substrate. Using conventional methods, an interconnection process is performed to form resistor electrodes 124a of FIG. 7A, which are formed to extend through the interlayer dielectric layer 126 and connect to both edges of the resistor pattern 108, and to form contact plugs 124g, which are connected to the source region 120s, the drain region 120d, and the gate electrode 114.

Figure 11:
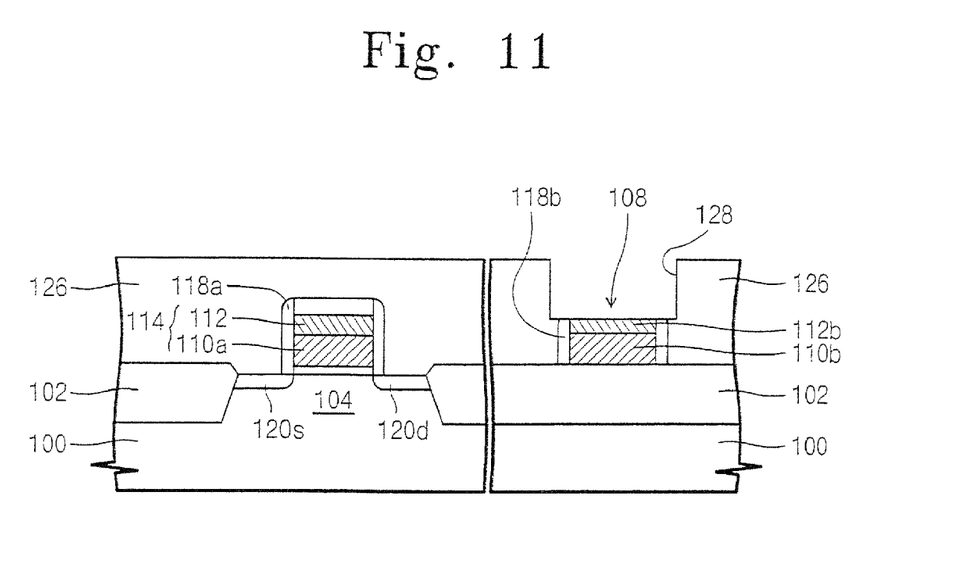
FIGS. 11 and 12 are cross-sectional diagrams showing a method of fabricating a semiconductor device with a resistor pattern in accordance with another embodiment of the invention, taken along line A-A of FIG. 7A.
Figure 12:
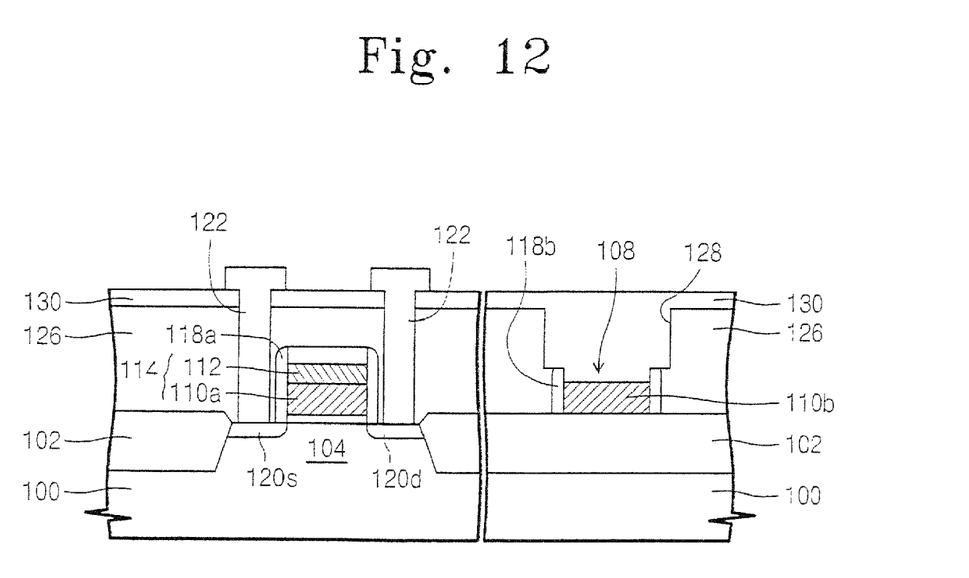

FIGS. 11 and 12 illustrate another embodiment of the invention. Referring to FIG. 11, using the same method of the embodiment explained with reference to FIG. 8, a gate electrode 114 is formed on the active region 104 and a resistor pattern 108 is formed on the device isolation layer 102. A first interlayer dielectric layer 126 is formed on an entire surface of the substrate. The first interlayer dielectric layer 126 is then patterned to form an opening 128, which exposes the entire or a portion of the top surface of the resistor pattern 108. The capping insulation layer 116a is etched to expose the top surface of the second metal silicide pattern 112b in the opening 128.

Referring to FIG. 12, the second metal silicide pattern 112b exposed in the opening 128 is removed to expose the top surface of the second polysilicon pattern 110b and inner sidewalls of the resistor spacers 118b, which are aligned to the sidewalls of the second polysilicon pattern 110b. Depending on the region exposed by the opening 128, the second metal silicide pattern 112b of the resistor pattern 108 can be completely removed or it could have a remaining part at both edges of the resistor pattern 108, such that the resistor pattern 108 includes a single polysilicon pattern and a multi-layered pattern of polysilicon and metal silicide.

Continuing to refer to FIG. 12, a second interlayer dielectric layer 130 is formed on the entire surface of the substrate. The second interlayer dielectric layer 130 fills the opening 128. A process for planarizing the second interlayer dielectric layer 130 may be further performed. Then, a contact plug 122 and resistor electrodes 124a of FIG. 7A are formed. The contact plugs 122 are connected to the source and drain regions 120s and 120d through both the first and second interlayer dielectric layers 126 and 130, and the resistor electrodes 124a are connected at both edges of the resistor pattern 108. In a case where the second metal silicide pattern 112b may remain at both edges of the resist pattern 108, the resistor electrodes 124a may be connected to the second metal silicide pattern 112b. In this case, the resistance value may decrease, but the pattern, except for both edges of the resistor pattern 108, is still a single polysilicon pattern that can achieve a sufficiently high sheet resistance. As a result, a semiconductor device with a resistor pattern of FIGS. 7A and 7B can be fabricated.

Figure 13A:
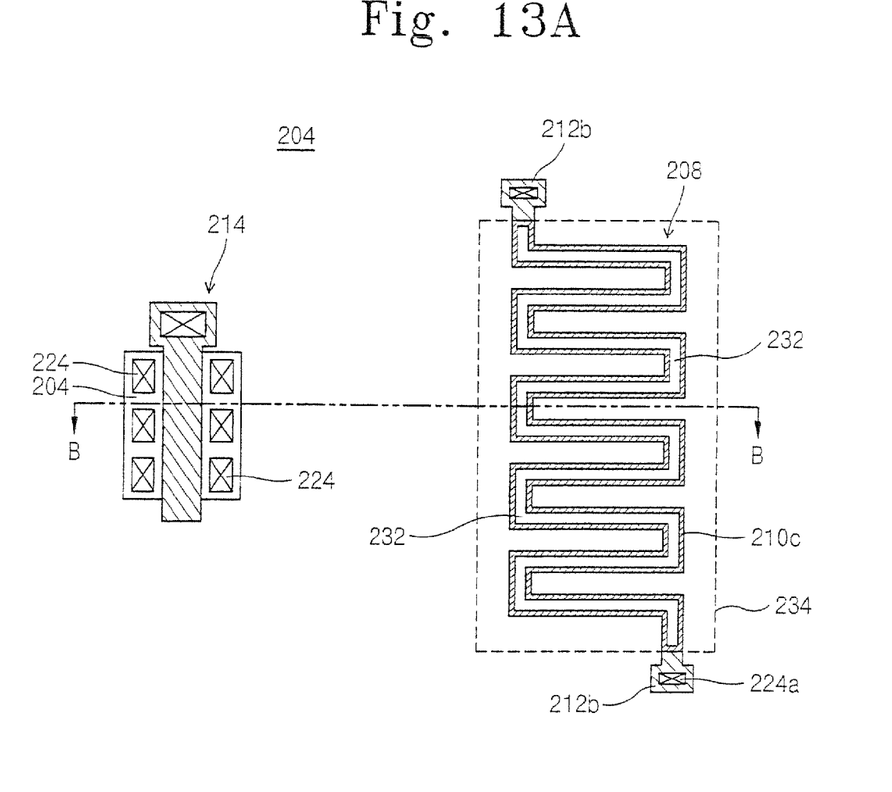
FIG. 13A is a layout diagram illustrating a semiconductor device with a resistor pattern in accordance with another embodiment of the present invention.

FIGS. 13A-16 illustrate other embodiments according to the invention. Referring to FIGS. 13A and 13B, a semiconductor device with a resistor pattern in accordance with this embodiment of the invention includes a device isolation layer 202, an active region 204, a gate electrode 214 disposed on the active region 204, and a resistor pattern 208 formed on the device isolation layer 202. In the same way as the previously described embodiment, the source and drain regions 220s and 220d are formed in the active region 204 and the gate electrode 214 is disposed on an active region 204 between the source and drain regions 220s and 220d. The gate electrode 214 has a polycide structure of a polysilicon pattern 210a and a metal silicide pattern 212a. A gate capping insulation layer 216 may be more formed on the metal silicide pattern 212a. An interlayer dielectric layer 226 covers the entire surface of the resulting substrate, contact plugs 222 are connected to the source and drain regions 220s and 220d, respectively, and resistor electrodes 224a are connected to both edges of the resistor pattern 208, respectively.

Figure 13B:
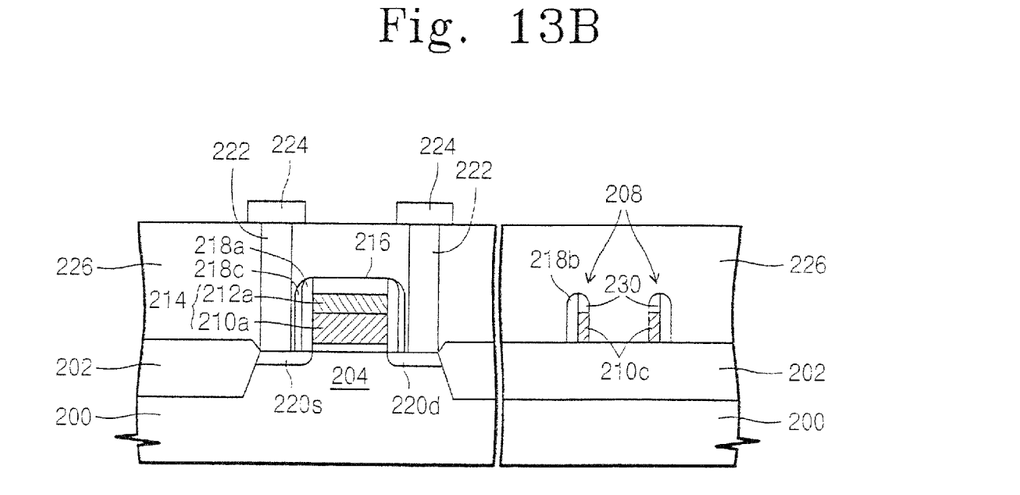
FIG. 13B is a cross-sectional diagram of a semiconductor device with a resistor pattern in accordance with the embodiment described with reference to FIG. 13A, taken along line B-B of FIG. 13A.

In this embodiment, the resistor electrodes 208 are disposed to be line-shaped and include a hollow region 232 where the device isolation layer 202 is exposed. Resistor spacers 218b are formed on outer sidewalls of the resistor pattern 208 and upper spacers 230 are disposed on the resistor pattern 208. Each of the upper spacers 230 has a vertical sidewall aligned to the outer sidewall of the resistor pattern 208 and a curved side wall opposite to the vertical sidewall. The edge of the curved sidewall is aligned to the sidewall of the hollow region 232. Each of the resistor spacers has a vertical sidewall contacting the outer sidewall of the resistor pattern 208 and the vertical sidewall of the upper spacer 230. Gate spacers are disposed on sidewalls of the gate electrode 214 and include first gate spacers 218a and second gate spacers 218c that are formed of a layer identical to the resistor spacers.

As illustrated in FIG. 13A, the hollow region 232 is formed between the edges of the resistor pattern 208. Both edges of the resistor pattern 208 are formed to have a structure of polysilicon and metal silicide that are sequentially stacked, and a region adjoining the hollow region 232 that has a single structure of polysilicon. Resistor electrodes 224a are connected to the metal silicide layer at both edges of the resistor pattern 208.

Figure 14:
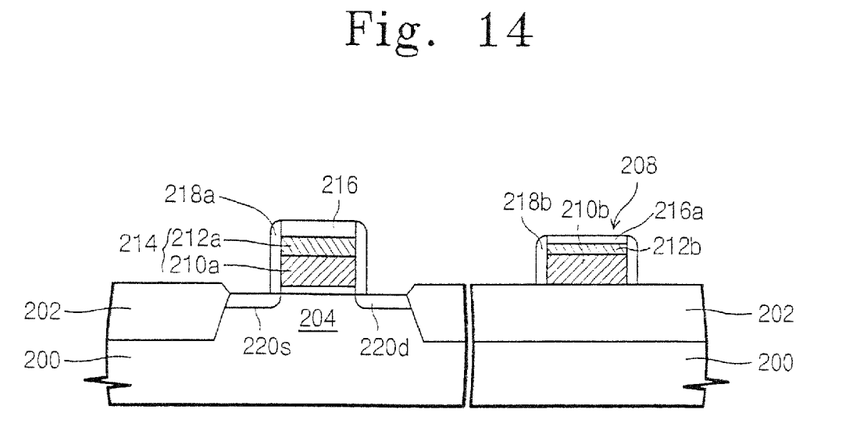
FIGS. 14-16 are cross-sectional diagrams showing a method of fabricating a semiconductor device with a resistor pattern in accordance with the embodiment described with reference to FIG. 13A, taken along line B-B of FIG. 13A FIGS. 17-19 are cross-sectional diagrams showing a method of fabricating a semiconductor device with a resistor pattern in accordance with another embodiment of the invention, taken along line B-B of FIG. 13A.

FIGS. 14-16 are cross-sectional views showing a method of fabricating the semiconductor device illustrated in FIGS. 13A and 13B. Referring to FIG. 14, a device isolation layer 202 is formed in a substrate 200 to define an active region 204. A source region 220s, a drain region 220d, and a gate electrode 214 are formed at the active region 204. The source and drain regions 220s and 220d are formed by implanting impurities into the active region 204 and the gate electrode 214 has a polycide structure, which is a sequential stacking of a polysilicon pattern 210a and a metal silicide pattern 212a. A gate capping insulation layer 216 may then be formed on the metal silicide pattern 212a. Gate spacers 218a are next formed on the sidewalls of the gate pattern 214. A resistor pattern 208 is formed on the device isolation layer 202. That is to say, a second polysilicon pattern 210b and a second metal silicide pattern 212b are sequentially stacked to form the resistor pattern 208. In addition, a capping insulation layer 216a may be formed on the second metal silicide pattern 212b. Resistor spacers 218b are formed on the sidewalls of the resistor pattern 208.

Figure 15:
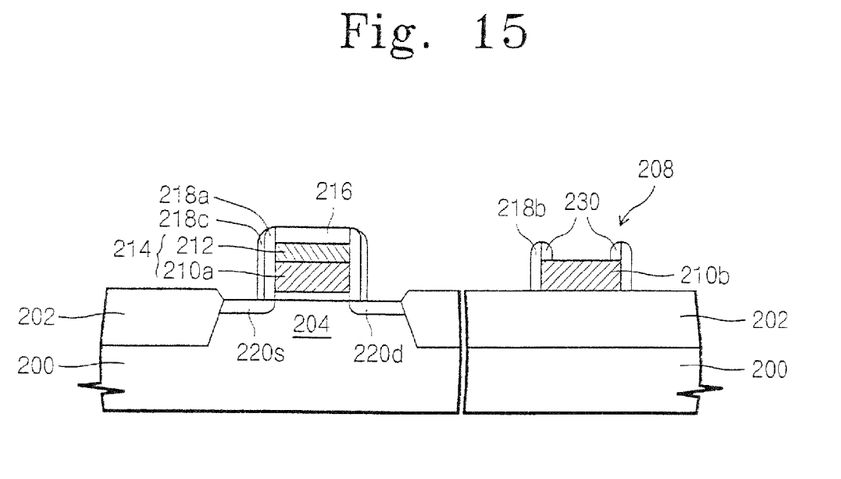

Referring to FIG. 15, the second metal silicide pattern 212b of the resistor pattern 208 is etched to expose the top surface of the second polysilicon pattern 210b and a portion of the inner sidewalls of the resistor spacers, which are aligned with the sidewalls of the second polysilicon pattern 210b. If a portion of the resistor pattern remains, a photoresist pattern covering both edges of the resistor pattern is used to preferably expose the rest of the polysilicon pattern. Up to this step, the method is identical to that of the previously described embodiment explained with reference to FIGS. 8 and 9.

However with this embodiment, upper spacers 230 are formed on the edges of the exposed second polysilicon pattern 210b as shown in FIG. 15. Continuing to refer to FIG. 15, the upper spacers 230 comprise a vertical sidewall that is formed on the inner sidewalls of the exposed resistor spacers and is aligned to both the sidewalls of the second polysilicon pattern 210b and the curved sidewall opposite to the vertical sidewall. In this case, additional spacers 218c are formed on the gate spacers 218a.

Figure 16:
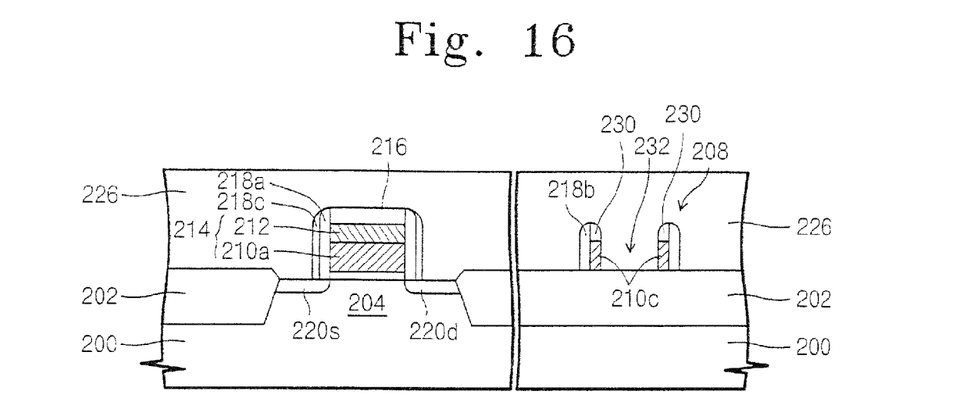

Referring to FIG. 16, using the upper spacers 230 as an etch mask, the second polysilicon pattern 210b is etched to expose the device isolation layer 202, thus creating hollow regions 232 where the device isolation layer 202 is exposed. The sidewalls of the hollow region 232 are aligned to the edges of the curved sidewalls of the upper spacers. Therefore, a width of the resistor pattern is determined by depending on the width of the upper spacers 230. The sheet resistance of the resistor pattern 208 is thereby increased due to the part of the resistor pattern 208 that was etched out for the hollow regions 232. In the above step of forming the hollow region 232, both edges of the resistor pattern 208 are covered with a photoresist pattern 234 of FIG. 13 and then etched. An interlayer dielectric layer 226 is formed on the entire surface of the substrate with the hollow region 232. Resistor electrodes 224a of FIG. 13 are formed to connect with both edges of the resistor pattern 208 through the interlayer dielectric layer 226, and contact plugs 224 are formed to connect with the source region 220s, the drain region 220d, and the gate electrode 214, thereby fabricating the semiconductor device with a resistor pattern illustrated in FIGS. 13A and 13B.

Figure 17:
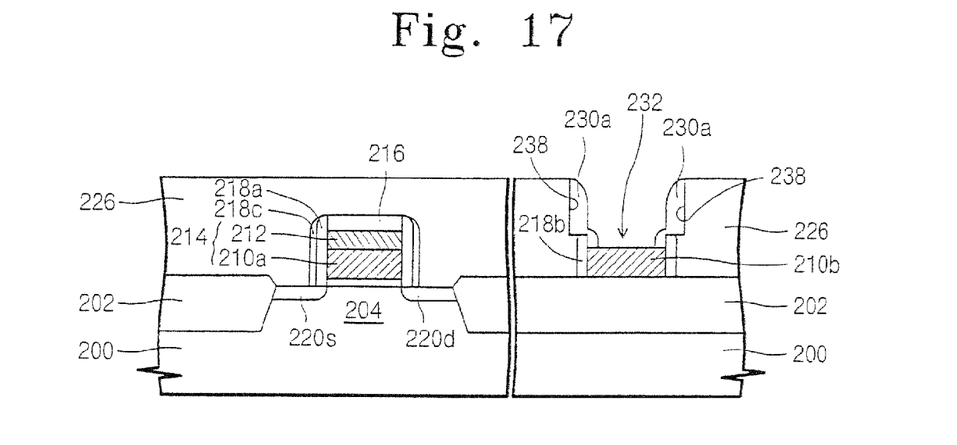
Figure 18:
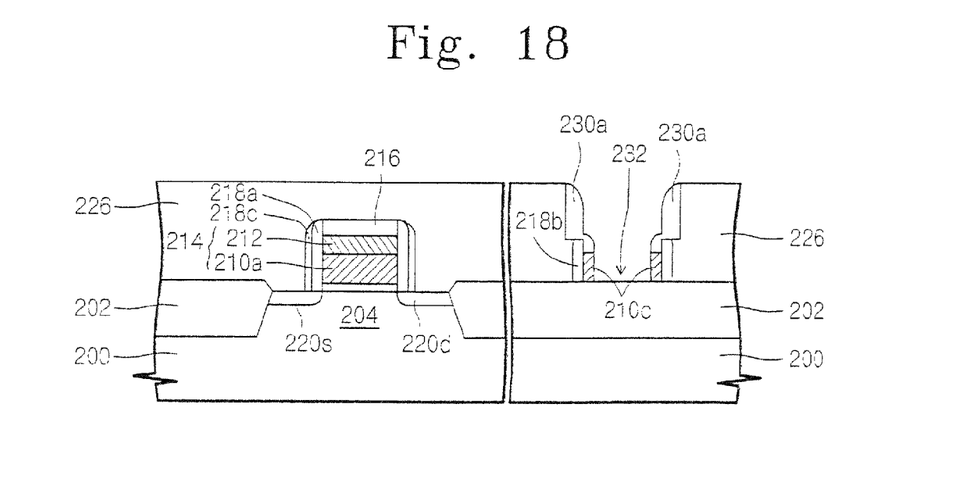
Figure 19:
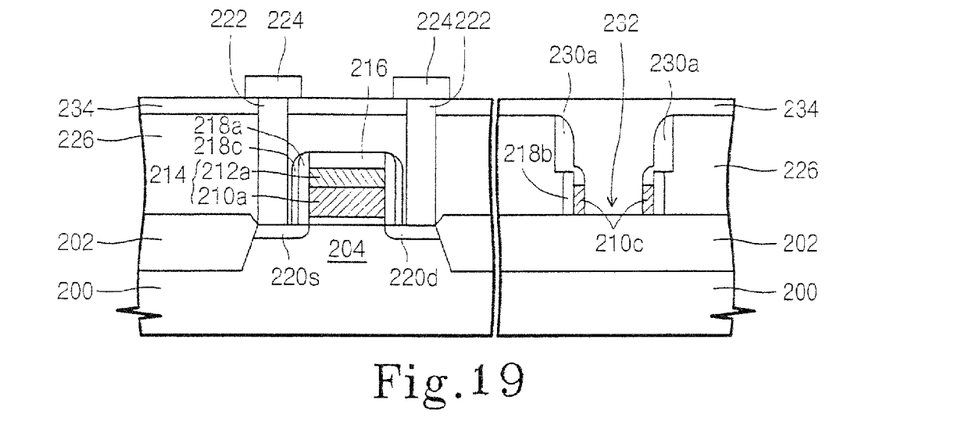

FIGS. 17-19 are cross-sectional views illustrating a variation of the above-described embodiment, taken along line B-B of FIG. 13A. Referring to FIG. 17, as described above, a gate electrode 214 is formed on the active region 204 and a resistor pattern 208 is formed on a device isolation layer 202. A first interlayer dielectric layer 226 with an opening 238 is formed on the entire surface of the substrate, and the entire or a portion of the top surface of the second polysilicon pattern 210b is exposed in the opening 238. Next, upper spacers 230a are formed on the sidewalls of the opening. The upper spacers 230a includes a vertical sidewall aligned to the second polysilicon pattern 210b and a curved sidewall opposite to the vertical sidewall.

Referring to FIG. 18, using the first interlayer insulation layer 226 and the upper spacers 230a as an etch mask, the second polysilicon pattern 210b is etched to expose a portion of the device isolation layer 202. As a result, hollow region 232 is formed where the device isolation layer 202 is exposed. The remaining second polysilicon patterns 210c forms the sidewalls of the hollow regions 232.

Figure 20:
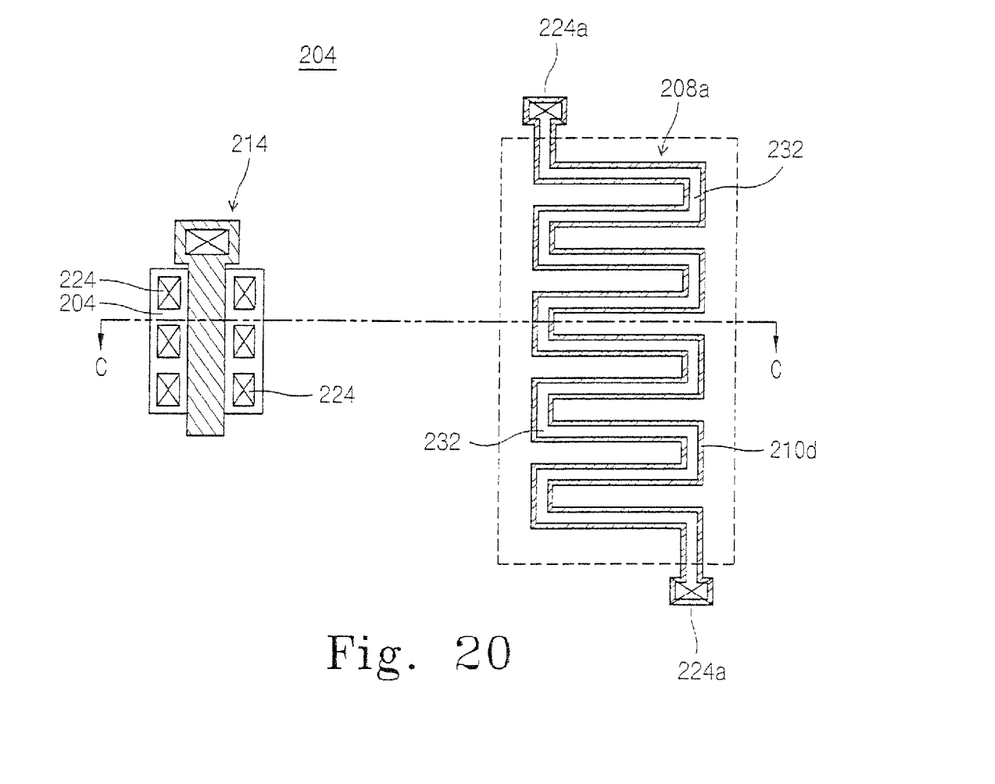
FIG. 20 is a layout view illustrating a semiconductor device in accordance with yet another embodiment of the present invention.

Referring to FIG. 19, a second interlayer dielectric layer 234 is formed on the entire resultant surface of the substrate. The second interlayer dielectric layer 234 fills the opening 238. Contact plugs 222 may be formed through the first and second and first interlayer dielectric layer 226 and 234 to connect with the source region 220s and the drain region 220d, and resistor electrodes 224a of FIG. 13A may be formed to connect with both edges of the resistor pattern 208. If the second metal silicide pattern 212b remains at both edges of the resistor pattern 208, the resistor electrodes 224a are connected to the top of the second metal silicide pattern 212, as illustrated in FIG. 13a. However, the resistor pattern 208 is still a single polysilicon pattern, except for both edges, and an efficiently high sheet resistance may be achieved. As a result, a semiconductor device with a resist pattern as illustrated in FIGS. 7A and 7B can be fabricated. If an opening 238 is formed to expose an entire surface of the resistor pattern 208, the second metal silicide pattern 212b of the resistor pattern 208 is completely removed and the entire top surface of the second polysilicon pattern 210b is exposed. In this case, as illustrated in FIG. 20, the resistor pattern 208 is a single polysilicon layer that thinly surrounds the hollow region 232. The resistor electrodes 224a are formed to overlap both edges of the resistor pattern 208.

Therefore, according to a broad aspect of the present invention, a semiconductor memory device with a resistor pattern, including a part having a single layer of polysilicon, is provided. The device includes a device isolation layer disposed in a substrate to define an active region, source and drain regions formed in the active region, and a gate electrode formed on the active region between the source and drain regions. Further, a gate insulation layer is interposed between the gate electrode and the active region, a resistor pattern is formed on the device isolation layer, and resistor electrodes are connected to both edges of the resistor pattern. In this case, the gate electrode includes a polysilicon pattern and a silicide pattern that are sequentially stacked on the gate insulation layer. However, the resistor pattern includes only a single polysilicon pattern. If the device is a SONOS memory device, the gate insulation is multi-layered and includes at least one silicon nitride layer.

According to another aspect of the present invention, a method of fabricating a semiconductor device that includes a resistor pattern, which is formed of a conductive layer having a high sheet resistance, is also provided. In this aspect, a device isolation layer is formed in a substrate to define an active region. A first conductive layer and a second conductive layer are then sequentially stacked on the active region and the device isolation layer to form a gate pattern and a resistor pattern, respectively. Gate spacers and resistor spacers are formed on the sidewalls of the gate pattern and the resistor pattern, respectively and the second conductive layer of the resistor pattern is removed to expose a portion of the inner sidewalls of the resistor spacers and the top of the first conductive layer. Resistor electrodes are next formed to connect with both edges of the resistor pattern. The first conductive layer may be formed of polysilicon and the second conductive layer may be formed of metal silicide having high conductivity.

An embodiment of the present invention can include the following method. A device isolation layer is formed in a substrate to define an active region, and a polysilicon layer and a metal silicide layer are sequentially stacked on the surface of the substrate. The polysilicon layer and the metal silicide layer are patterned to form a gate pattern comprising a first polysilicon pattern and a first silicide pattern on the active region, and to form a line shaped resistor pattern comprising a second polysilicon pattern and a second silicide pattern on the device isolation layer. Gate spacers and resistor spacers are formed on the sidewalls of the gate pattern and the resistor pattern, respectively. Next, the second silicide pattern is etched to expose a portion of the inner sidewalls of the resistor pattern that is aligned to the sidewalls and top of the second polysilicon pattern. An interlayer dielectric layer is then formed on the entire surface of the substrate. Resistor electrodes are formed to extend through the interlayer dielectric layer and connect with both edges of the resistor pattern.

In another embodiment of the present invention, a method of fabricating the semiconductor substrate comprises the following. A device isolation layer is formed in a substrate to define an active region. A polysilicon layer and a silicide layer are stacked on the entire surface of the substrate. The polysilicon layer and the silicide layer are patterned to form a gate pattern comprising a first polysilicon pattern and a first silicide pattern on the active region, and to form a line-shaped resistor pattern comprising a second polysilicon pattern and a second silicide pattern on the device isolation layer. Gate spacers and resistor spacers are formed on the sidewalls of the gate pattern and the resistor pattern, respectively. The second silicide pattern of the resistor pattern is etched to expose a portion of the inner sidewall of the resistor pattern that is aligned to sidewalls and the top of the second polysilicon pattern. Upper spacers are then formed on the inner sidewalls of the exposed resistor spacers on the second polysilicon pattern. The upper spacers are formed to have a vertical sidewall aligned to the inner sidewall of the resistor spacers and a curved sidewall opposite to the vertical sidewall. Using the upper spacers as an etch mask, the second polysilicon pattern is etched to form hollow regions where the device isolation layer is exposed. The hollow region includes sidewalls aligned to the curved sidewalls of the upper spacers. Resistor electrodes are next connected to both edges of the resistor pattern.

According to the present invention, a polysilicon resistor having a high sheet resistance can be formed when a gate electrode with polycide structure is formed, a resistor pattern with a polycide structure is formed, and then a metal silicide layer of the resistor pattern is removed. In addition, a portion of the resistor pattern can be removed to form a hollow region, thereby reducing the cross-section area and increasing the sheet resistance.

Those skilled in the art recognize that the method of forming integrated circuits described herein can be implemented in many different variations. Therefore, although various embodiments are specifically illustrated and described herein, it will be appreciated that modifications and variations of the present invention are covered by the above teachings and within the purview of the appending claims without departing from the spirit and intended scope of the invention.

What is claimed is:

1. A SONOS memory device comprising:
a device isolation layer disposed in a substrate to define an active region;
source and drain regions formed in the active region;
a gate electrode formed on the active region between the source and drain regions;
a gate insulation layer interposed between the gate electrode and the active region, and being multi-layered and at least one silicon nitride layer;
a resistor pattern formed on the device isolation layer;
resistor spacers disposed on sidewalls of the resistor pattern; and
a resistor electrode connected to an end portion of the resistor pattern, wherein the gate electrode includes a polysilicon layer and a silicide layer that are sequentially stacked on the gate insulation layer, wherein the resistor pattern includes a polysilicon layer, and wherein a majority of the resistor pattern except for the end portion does not have a silicide layer directly disposed thereon.

2. The device of claim 1, wherein the resistor pattern comprises a line-shaped polysilicon layer.

3. The device of claim 1, wherein the resistor pattern includes a silicide pattern stacked on the end portion of the polysilicon layer.

4. The device of claim 3, wherein the resistor electrode is connected to the silicide pattern.

5. The device of claim 1, wherein the resistor pattern is in direct contact with the device isolation layer.

6. The device of claim 5, wherein the device isolation layer includes a first sidewall portion having a negative slope and second sidewall portion having a positive slope, wherein a length of the first sidewall portion is longer than that of the second sidewall portion.

7. The device of claim 1, further comprising an interlayer dielectric layer disposed on a portion of the resistor pattern.

8. The device of claim 7, wherein each of the resistor spacers includes a vertical inner sidewall protruding above the resistor pattern and wherein the interlayer dielectric layer contacts a portion of the vertical inner sidewall of each of the resistor spacers.

9. A semiconductor device comprising:
a device isolation layer disposed in a substrate to define an active region;
source and drain regions formed in the active region;
a gate electrode formed on the active region between the source and drain regions;
a gate insulation layer interposed between the gate electrode and the active region, and being multi-layered and at least one silicon nitride layer;
a resistor pattern formed on the device isolation layer;
resistor spacers disposed on sidewalls of the resistor pattern;
a planarized interlayer dielectric layer disposed over the resistor pattern; and
resistor electrodes connected to both end portions of the resistor pattern;
wherein the gate electrode includes a polysilicon layer and a silicide layer that are sequentially stacked on the gate insulation layer, wherein the resistor pattern comprises a polysilicon layer and a silicide layer stacked on each of the end portions except for a majority of the polysilicon layer, and wherein the resistor electrodes are connected to the silicide layer.

10. The device of claim 9, wherein the resistor pattern comprises a line-shaped polysilicon layer.

11. The device of claim 9, wherein the resistor pattern is in direct contact with the device isolation layer.

12. The device of claim 9, wherein the device isolation layer includes a first sidewall portion having a negative slope and second sidewall portion having a positive slope, wherein a length of the first sidewall portion is longer than that of the second sidewall portion.

13. The device of claim 9, further comprising an interlayer dielectric layer disposed on a portion of the resistor pattern.

14. A SONOS memory device comprising:
a device isolation layer disposed in a substrate to define an active region;
source and drain regions formed in the active region;
a gate electrode formed on the active region between the source and drain regions;
a gate insulation layer interposed between the gate electrode and the active region, and being multi-layered and at least one silicon nitride layer;
a resistor pattern formed on the device isolation layer;
resistor spacers disposed on sidewalls of the resistor pattern;
a resistor electrode connected to an end portion of the resistor pattern, wherein the gate electrode includes a polysilicon layer and a silicide layer that are sequentially stacked on the gate insulation layer, wherein the resistor pattern includes a polysilicon layer, and wherein a majority of the resistor pattern except for the end portion does not have a silicide layer directly disposed thereon; and
an interlayer dielectric layer disposed on a portion of the resistor pattern, wherein the interlayer dielectric layer contacts a portion of the resistor spacers.

15. A semiconductor device comprising:
a device isolation layer disposed in a substrate to define an active region;
source and drain regions formed in the active region;
a gate electrode formed on the active region between the source and drain regions;
a gate insulation layer interposed between the gate electrode and the active region, and being multi-layered and at least one silicon nitride layer;
a resistor pattern formed on the device isolation layer;

resistor spacers disposed on sidewalls of the resistor pattern;
a planarized interlayer dielectric layer disposed over the resistor pattern;
resistor electrodes connected to both end portions of the resistor pattern,
wherein the gate electrode includes a polysilicon layer and a silicide layer that are sequentially stacked on the gate insulation layer, wherein the resistor pattern comprises a polysilicon layer and a silicide layer stacked on each of the end portions except for a majority of the polysilicon layer, and wherein the resistor electrodes are connected to the silicide layer; and
an interlayer dielectric layer disposed on a portion of the resistor pattern, wherein the interlayer dielectric layer contacts a portion of the resistor spacers.

* * * * *